United States Patent
Taussig et al.

(10) Patent No.: US 7,106,639 B2
(45) Date of Patent: Sep. 12, 2006

(54) DEFECT MANAGEMENT ENABLED PIRM AND METHOD

(75) Inventors: Carl P. Taussig, Redwood City, CA (US); Richard E. Elder, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/931,842

(22) Filed: Sep. 1, 2004

(65) Prior Publication Data

US 2006/0044896 A1 Mar. 2, 2006

(51) Int. Cl.
- G11C 7/00 (2006.01)
- G11C 29/00 (2006.01)
- G11C 11/00 (2006.01)
- G11C 8/00 (2006.01)
- G11C 8/02 (2006.01)
- G11C 5/08 (2006.01)

(52) U.S. Cl. ............... 365/200; 365/130; 365/201; 365/230.03; 365/231; 365/66; 365/69; 365/163; 365/230.06

(58) Field of Classification Search ............... 365/200, 365/201, 230.03, 231, 130; 714/, 714/710
See application file for complete search history.

(56) References Cited

U.S. PATENT DOCUMENTS

| | | | | |
|---|---|---|---|---|
| 6,034,882 A | * | 3/2000 | Johnson et al. | 365/103 |
| 6,137,736 A | * | 10/2000 | Kitayama | 365/200 |
| 6,144,577 A | * | 11/2000 | Hidaka | 365/63 |
| 6,246,614 B1 | * | 6/2001 | Ooishi | 365/191 |
| 6,335,897 B1 | * | 1/2002 | Yoo | 365/230.03 |
| 6,385,075 B1 | | 5/2002 | Taussig et al. | |
| 6,478,231 B1 | | 11/2002 | Taussig | |
| 6,552,409 B1 | | 4/2003 | Taussig | |
| 6,567,295 B1 | | 5/2003 | Taussig et al. | |
| 6,599,796 B1 | | 7/2003 | Mei et al. | |
| 6,646,912 B1 | | 11/2003 | Hurst et al. | |
| 6,687,168 B1 | | 2/2004 | Fischer | |
| 6,738,307 B1 | * | 5/2004 | Eaton et al. | 365/230.06 |
| 6,895,490 B1 | * | 5/2005 | Moore et al. | 711/203 |
| 6,919,633 B1 | * | 7/2005 | Perlov et al. | 257/724 |
| 2003/0133023 A1 | * | 7/2003 | Carau, Sr. | 348/231.99 |
| 2003/0223292 A1 | * | 12/2003 | Nejad et al. | 365/200 |
| 2004/0100831 A1 | * | 5/2004 | Knall et al. | 365/200 |
| 2004/0109360 A1 | * | 6/2004 | Bateman et al. | 365/189.02 |
| 2005/0052935 A1 | * | 3/2005 | Miyo et al. | 365/230.03 |

* cited by examiner

Primary Examiner—Amir Zarabian
Assistant Examiner—Ly Duy Pham

(57) ABSTRACT

A defect management enabled PIRM including a data storage medium providing a plurality of cross point data storage arrays. Each array provides a plurality of memory cells. The arrays are allocated into separate super arrays, the separate super arrays virtually aligned as sets. A controller is also provided, capable of establishing the selection of a virtually aligned set of arrays and a virtually aligned set of memory cells. The controller is operable during a write operation to receive a word of data bits and detect a defective array in the selected virtually aligned set of memory arrays. The controller is further capable of directing the allocation of at least one data bit from the defective memory array to a spare memory array.

7 Claims, 15 Drawing Sheets

FIG. 6 WORD SPARING

SPARING ON A LAYER

DEFECT MANAGEMENT ENABLED PIRM AND METHOD

FIELD OF THE INVENTION

The present invention relates generally to memory systems, and in particular to a defect management enabled portable inexpensive rugged memory ("PIRM"), and method strategies therefore.

Nearly every computer and electronic device uses memory components or memory elements to store information. The variety of information stored is expansive. Typically, but not exclusively, this information may be operating system instructions, data undergoing processing, data stored for later retrieval such as document files, image files, music files, program codes, and the like.

Many devices, such as, digital cameras for still and/or moving pictures, generate large amounts of digital information representing images. Generally speaking, greater image resolution requires a larger amount of digital information storage. A single high resolution image may easily require several megabytes of digital storage space.

Generally speaking, the user of a digital camera may desire to take more than one picture, and frequently may desire to use the camera in a portable fashion—free of connections to external power supplies or storage devices. Music playing devices, such as MP3 players and other devices, also provide large storage capacity while also permitting portable use and enjoyment.

Three user device requirements generally attach to a memory device for these types of information storage applications. The first requirement is that the memory device be physically small enough to be removably integrated into the device, but also provide enough storage capacity to be of beneficial use. The second requirement is that the memory devices have low power consumption (e.g. <<1 Watt), so that large batteries are not needed. For portable devices, there is a third desirable requirement—that the memory device have relatively rugged physical characteristics so as to operate and survive in a variety of environments. Current designs to meet these requirements are expensive to produce.

It is generally accepted in the computer arts that information is most easily stored, processed and otherwise manipulated in binary form—a series of logic states represented as "0" or "1". The ability to store information, such as the logic state of a "0" or a "1" within a single memory device, is therefore generally predicated upon the ability to establish one of two states, e.g. a high resistance or a low resistance.

Within the memory arts, it is generally accepted that memory devices may be either volatile or non-volatile. The information stored in volatile memory is preserved so long as power is continuously supplied. Upon removal of the power, the information stored in the memory will likely be lost. Typically, traditional main memory RAM in a computer is volatile memory.

In contrast, the information retention of non-volatile memory is not power dependent. Non-volatile memory accomplishes this long term, non-power dependent storage ability typically through the stable change of a physical property, such as, for example, changing the optical reflectivity of a material as in a CD or DVD, the creation of bumps or dips in a polymer surface, or the polarization of a ferromagnetic material.

With semiconductor based memory elements, the stored data value may be indicated by a sensible state such as the amount of charge stored in a capacitor or the relative state of resistance across the memory element. By way of example, a high resistance may indicate a binary "1" while a low resistance may indicate a binary "0".

Semiconductor-based non-volatile memory devices are becoming increasingly common as more and more products requiring larger and larger amounts of memory storage, especially in portable form. For example, early digital cameras frequently utilized a 3.5" floppy disc with 1.44 megabytes of memory for storing the digital information of a picture. Contemporary digital cameras of today frequently create images that are far in excess of 1.44 megabytes—utilizing semiconductor data storage chips with 32, 64, 128 or more megabytes of storage.

In many instances, long term storage devices are re-writable. Information may be written to the device at one point in time and later over-written with new information. The ability to provide re-writability in a non-volatile data storage device often increases the manufacturing complexity, as well as the control logic and circuitry within the device. These circumstances increase the manufacturing cost of such devices.

The cost associated with the re-writeable nature of a device is often far greater than the perceived benefit of re-writing when lest costly alternatives are available. This may be especially true when the quantity of memory is large and the price of the device is low. For example although re-writable CD's and DVD's exist, many consumers opt to use write-once CD's and DVD's. This is a choice frequently driven by the factors such as the material being intended for archival use and, thus, not requiring re-writeable properties; the amount of time required to re-write the device over simply starting with a fresh disc; and/or simply the relative cost. A re-writeable disc may cost many times the price of a single write disc.

The ability to achieve a memory archive with a longevity measured in multiple decades, if not longer, is often desired, as for example in digital photography applications. A re-writeable memory device typically does not have the same level of archivability as a write-once device. For example, a flash memory device involves a trapped electrical charge which will dissipate over time.

With respect to memory devices for portable devices such as digital cameras, music players, personal data assistances, and the like, the vast majority of memory devices available are re-writeable. Frequently, the re-write nature of the storage device is not of high value or concern to the user. Indeed more use and enjoyment might be experienced with single write, lower cost memory devices. Even so, nonvolatile write-once memories are not widely used due to high cost, slow write speeds, low density, and/or poor reliability.

One form of non-volatile memory device with application potential to the portable user market incorporates layers of cross-point diode memory arrays. One potentially costly element associated with high capacity non-volatile memory devices is the sheer number of connections between the memory device and the controller chip. Multiplexing schemes may permit a reduced number of connection lines to control a large number of memory elements. However, in conventional integrated circuits multiplexing is accomplished by logic gates synthesized from transistors.

It is undesirable to include transistors in a diode-based cross-point memory array because transistors add to the fabrication processing difficulties, thereby increasing the fabrication costs. In addition, some transistor processing steps may be incompatible with other materials used in a diode based cross-point array.

Hence there is a need for an improved non-volatile memory device and the components thereof that overcomes one or more of the drawbacks identified above.

SUMMARY

The present disclosure advances the art by providing defect management strategies for defect management enabled PIRM.

In particular and by way of example only, according to an embodiment, provided is a defect management enabled PIRM including: a data storage medium providing a plurality of cross point data storage arrays each providing a plurality of memory cells, the plurality of data storage arrays allocated into separate physical groups, the separate physical groups virtually aligned as sets; a controller capable of establishing the selection of a virtually aligned set of arrays and a virtually aligned set of memory cells; the controller being operable during a data write operation to receive a word of data bits and detect a defective cell in a defective array in a selected virtually aligned set of memory cells, the controller further directing the allocation of at least one data bit from the defective memory array to a spare memory array.

DETAILED DESCRIPTION

Before proceeding with the detailed description, it is to be appreciated that the present teaching is by way of example, not by limitation. Thus, the instrumentalities described herein are, for the convenience of explanation, shown and described with respect to exemplary embodiments. It will be appreciated that the principles shown and described herein may be equally applied in other types of portable inexpensive rugged memory ("PIRM").

In the following description, the term "data" is understood and appreciated to be represented in various ways depending upon context. Generally speaking, the data at issue is primarily binary in nature, represented as logic "0" and logic "1". However, it will be appreciated that the binary states in practice may be represented by relatively different voltages, currents, resistance or the like which may be measured, and unless particularly stated otherwise it is generally immaterial whether a particular practical manifestation of data within a memory element represents a "0" or a "1".

Figure 1:
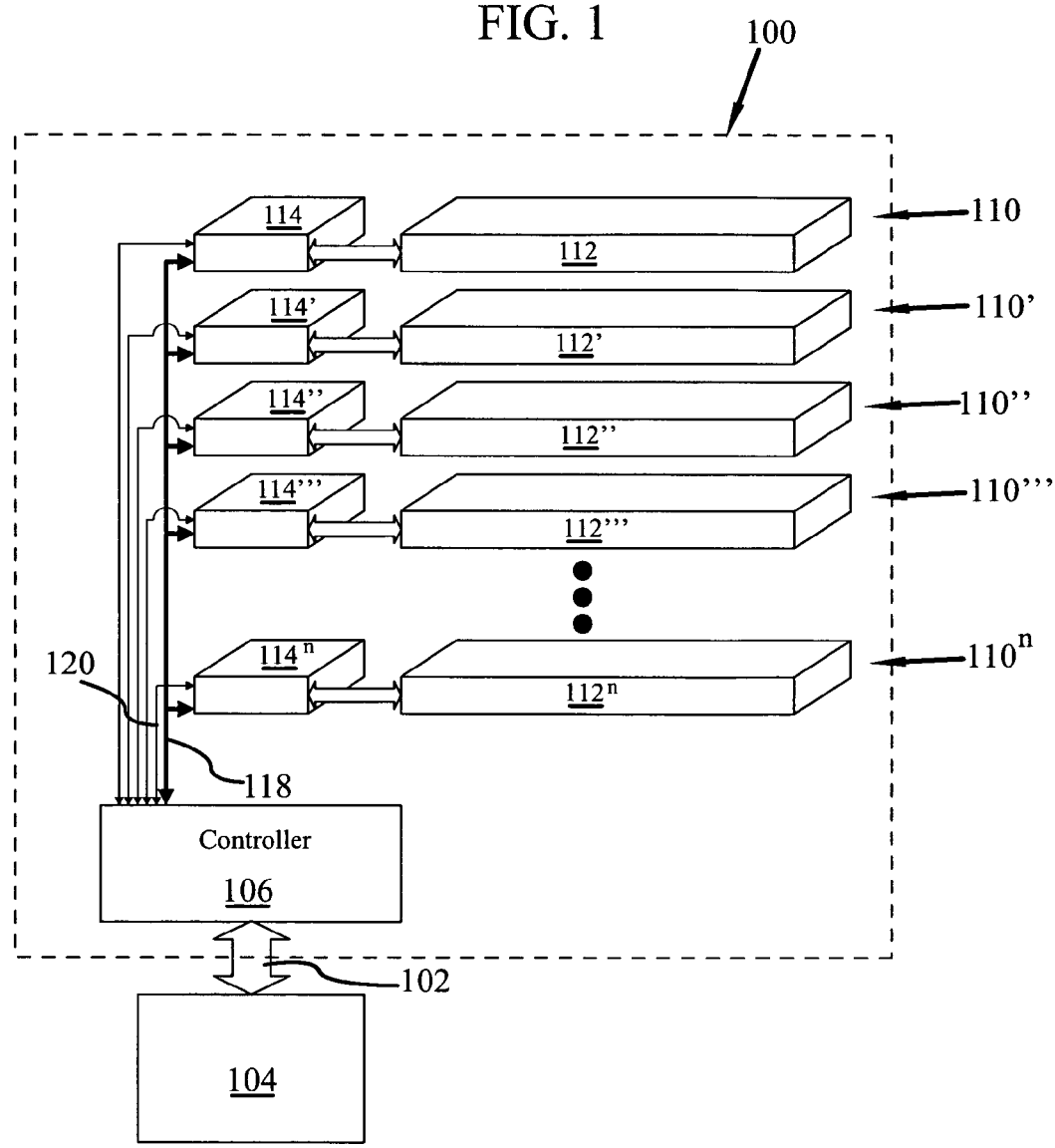
FIG. 1 is a schematic block diagram of a defect management enabled PIRM illustrating the general structure of the PIRM according to an embodiment.

Referring now to the drawings, and more particularly FIG. 1, there is shown a block representation of a PIRM 100, providing write-once data storage. PIRM 100 has an I/O interface connector 102 permitting PIRM 100 to be removably coupled to a user device 104, such as, for example, a camera, MP3 player, recorder, or other storage utilizing device via a common memory card interface such as SecureDigital (SD), MultiMedia Card (MMC), memory stick or CompactFlash (CF).

In at least one embodiment, interface connector 102, interface and control circuit ("controller") 106 and PIRM 100 are fabricated as a unified removable structure. A suitable controller 106 may be comprised of analog circuitry, a digital processor, a CPU programmed with control logic, a device driver, and combinations thereof. In at least one alternative structure, interface connector 102 is provided upon a removable memory card, the card also providing a socket or the like for receiving a removable PIRM 100 with integrated controller 106. In yet another embodiment, interface connector 102 and controller 106 are provided upon a removable card, the card also providing a socket or the like for receiving a removable PIRM 100.

Such removablility of PIRM 100 may be advantageous in permitting re-use of interface connector 102, a reduction in physical storage space for storing PIRM's 100 with archival data, and reduced fabrication costs. For the purposes of defect management, incorporating the controller 106 as a component of PIRM 100 is generally preferred, as such integration may alleviate the need for a separate defect management map or table.

Write-once data storage is generally understood to imply that data can be written only once to the memory and thereafter it cannot be changed arbitrarily. For example, many write-once memories are fabricated with each memory cell in a first bit state (e.g. represented by a binary data "0"). During a write procedure, the state of a selected memory cell is altered to a second state (e.g. represented by a binary data "1"). Such state alteration is considered irreversible such that it cannot be reversed without potentially harming the entire device.

In the above configurations, interface connector 102 and interface and control circuit 106 provide I/O control between PIRM 100 and user device 104. PIRM 100 is comprised of from a stack of laminated layers 110, 110', 110'', ~110'''. Each physical layer 110 provides a data storage medium providing a plurality of cross point data storage memory arrays 112, each providing a plurality of addressable memory cells (not shown).

Each physical layer 110 also provides addressing circuitry 114 coupling the respective memory arrays 112 of each layer 110 to controller 106 by interconnections 116. Addressing circuitry 114 provides a permuted addressing scheme for addressing the memory elements within the respective memory arrays 112. Such addressing circuitry 114 is discussed in greater detail in U.S. Pat. No. 6,552,409 entitled "Techniques for Addressing Cross-point Diode Memory Arrays", incorporated herein by reference, and U.S. Pat. No. 6,567,295 entitled "Addressing and Sensing a Cross Point Diode Memory Array", incorporated herein by reference. As shown, in at least one embodiment, each array 112 is associated with it's own addressing circuitry 114. Moreover, controller 106 comprises circuitry for control, interface, detection, error correction coding (ECC) and the like for PIRM 100.

Figure 2:
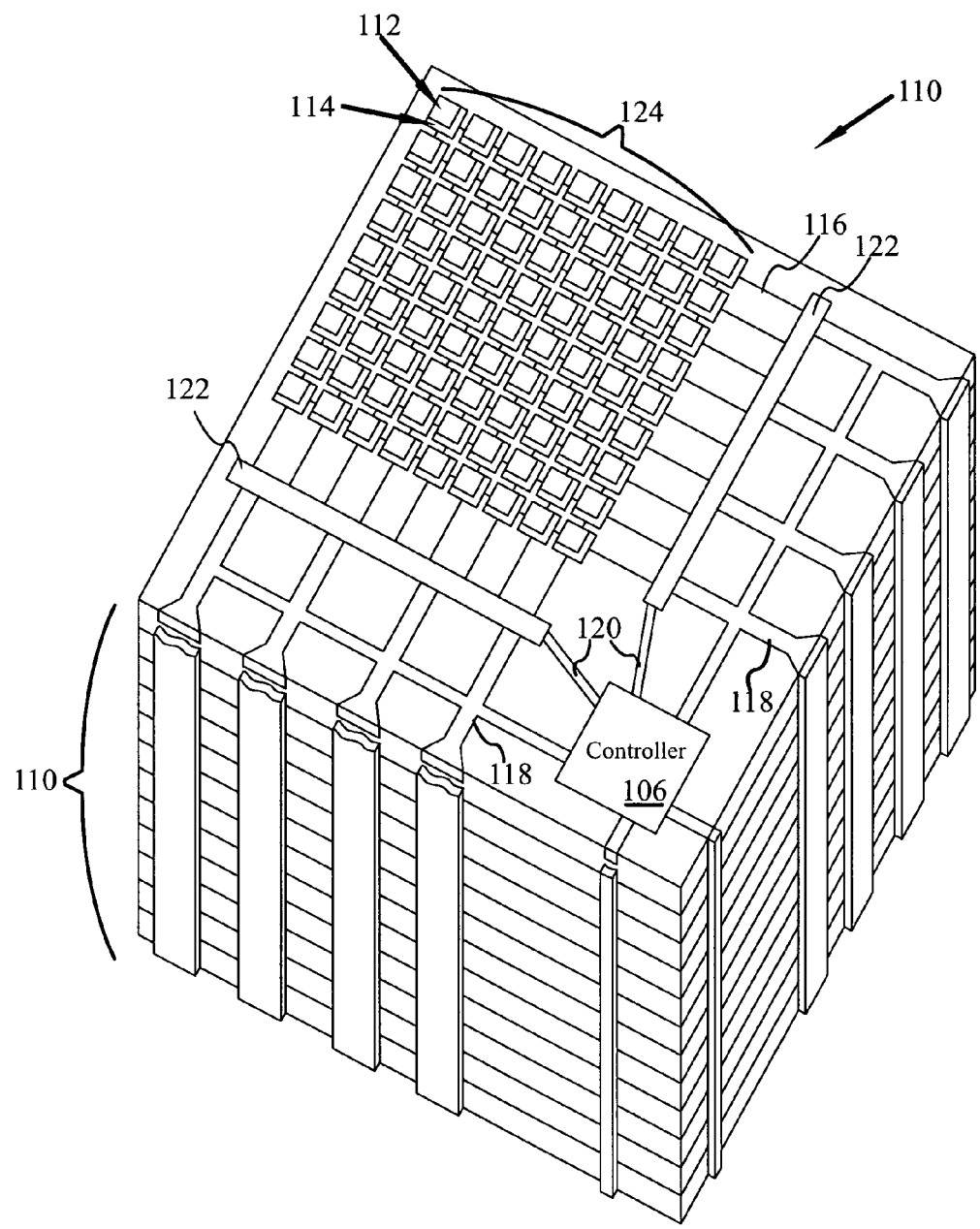
FIG. 2 is a cut-away perspective view of a defect management enabled PIRM according to an embodiment.

FIG. 2 is a partial cut-away perspective view of PIRM 100, showing at least one physical arrangement of the circuits and layers in a PIRM 100. As may be more fully appreciated, each layer 110 provides a plurality of arrays 112, such that the arrays 112 may be viewed as allocated into separate super arrays 124. In at least one embodiment, each super 124 array is provided as a separate physical group, such as a layer 110. In at least one alternative embodiment, multiple separate super arrays may be provided on each layer 110.

Addressing circuits 114 assist the controller 106 in selecting a specific memory cell within a specific array 112. Controller 106 communicates publicly with addressing circuits 114 on each layer by connection lines 118. Connection lines 118 may provide simultaneous connections to multiple layers 110 sharing common conductors. Controller 106 may communicate privately with sense and control circuits 122 on each layer by private connection lines 120. Generally there is only one controller 106 present in a PIRM 100. Although shown on the top layer 110, the controller 106 may be provided on any layer as dictated by fabrication or other preferences.

As each layer 110 is intended to be substantially identical, there is likely substantial vertical alignment between the arrays of one layer and the next. Such vertical alignment is helpful for purposes of discussion, however, it should be appreciated that in operation the arrays are virtually aligned (e.g. the arrays may in actuality be vertically aligned, or they may simply be logically arranged as if they were vertically aligned). Stated another way, virtual alignment is based on a logical association, and not necessarily tied to physical alignment.

The controller 106 is capable of establishing a selection of virtually aligned set of arrays 112 and, more specifically, a virtually aligned set of memory cells. In at least one embodiment, such selection of a virtually aligned set of arrays 112, and memory cells within each array 112 is further facilitated by sense and control circuits 122 and addressing circuitry 114.

Each array 112 is provided with interconnections 116 for row power, column power, row address, column address, and sense/write enable. For sparing, as described below, additional connection lines may be provided. The arrays 112 share these various connections and interconnections in such a way as to minimize the number of connections to the controller 106, while preventing unaddressed arrays 112 from dissipating power and interfering with data detection.

Providing a large number of arrays 112 upon each layer 110 within PIRM 100 may be advantageous for many reasons. For example, for a fixed minimum feature size, the larger the number of arrays on each layer 110, the smaller each array 112 will be. In general, smaller arrays 112 consume less power (as not all of the arrays 112 on a layer 110) will be active simultaneously) and have less capacitance, hence they may operate at higher speeds. In addition, a plurality of arrays 112 may be advantageous in defect management.

An inherent aspect of PIRM 100 in obtaining low cost (both for the fabricator and consumer) is that PIRM 100 should be tolerant of manufacturing defects. Providing a PIRM 100 that is subdivided into a large plurality of arrays 112, may assist in the defect management strategies described below and minimize the amount of memory lost to un-repairable manufacturing defects, and/or require fewer parts to be discarded due to excessive defects.

Stated simply, defect management for PIRM 100 is based upon an ability to detect a defective memory array 112 within PIRM 100, and following detection, re-allocate the data bits from (or intended for) the defective memory array 112 to a spare array within PIRM 100. This spare array is commonly referred to as a spare.

In at least one embodiment, the defect management is handled through Word Sparing. In another embodiment, the defect management is handled through Sparing on a Layer. In yet another embodiment, the defect management is handled through Sparing on a Dedicated Layer.

Figure 3:
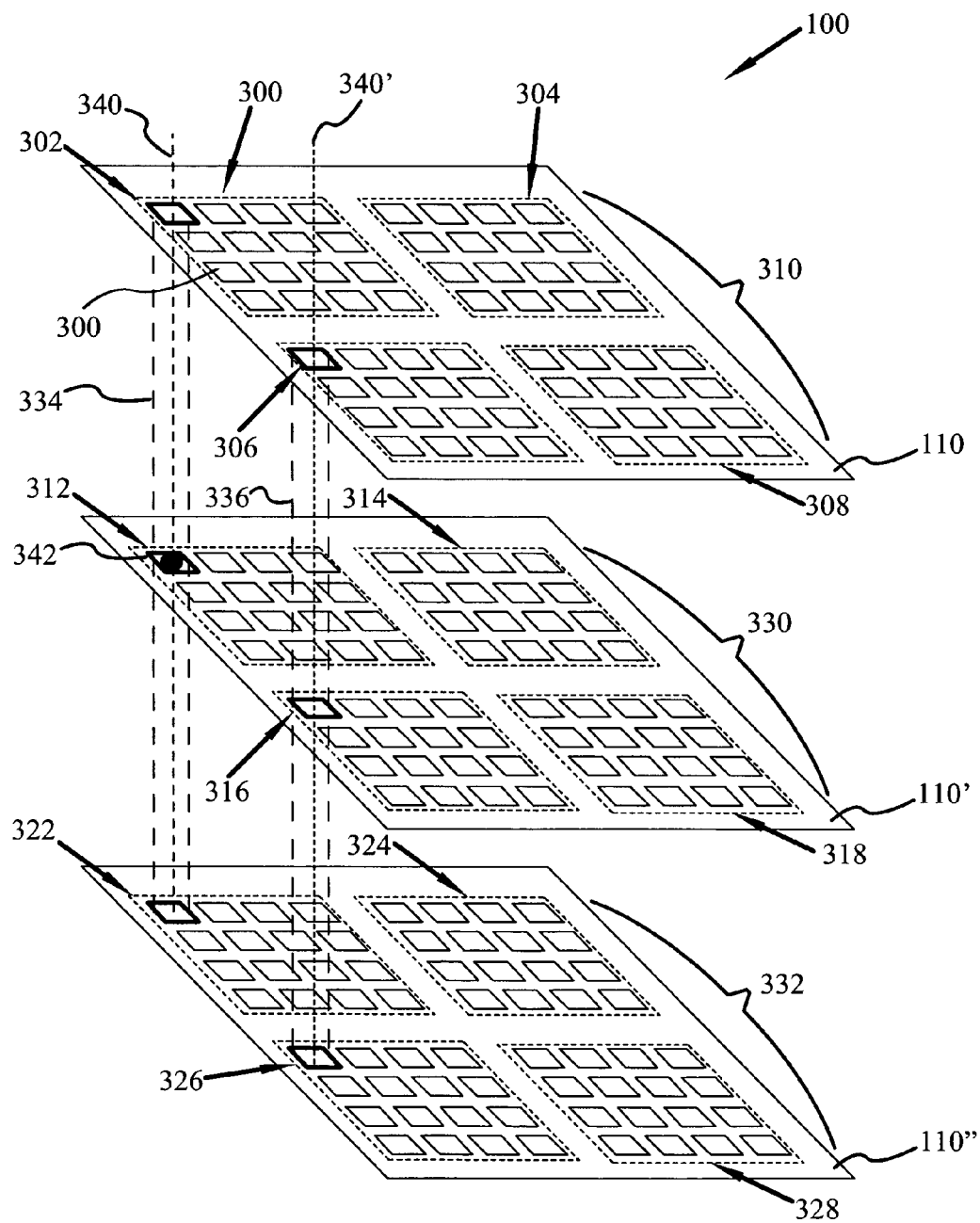
FIG. 3 is a 3-D diagram illustrating the general form of defect management through Word Sparing in at least one embodiment.
Figure 4:
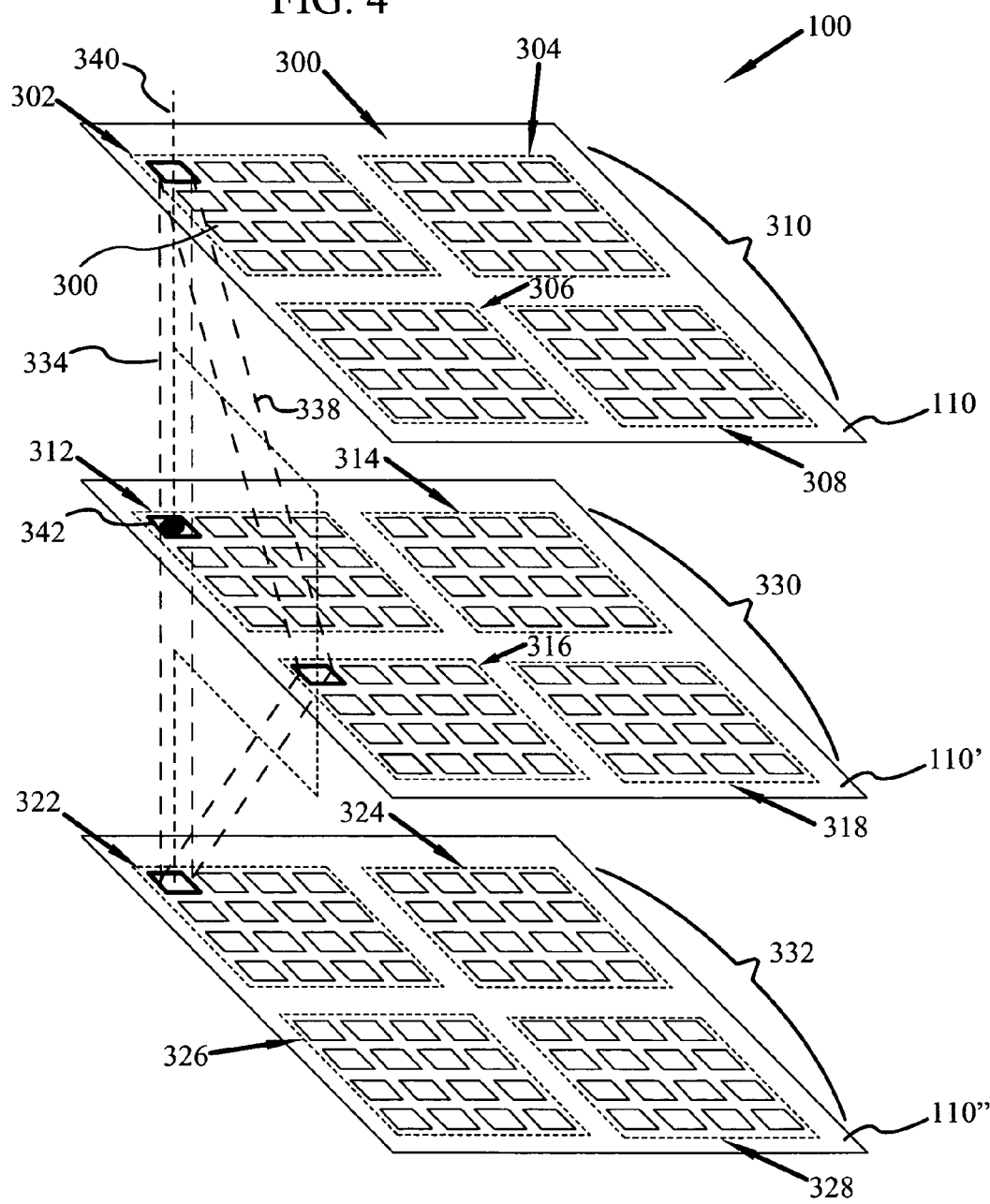
FIG. 4 is a 3-D diagram illustrating the general form of defect management through Sparing on a Layer in at least one embodiment.
Figure 5:
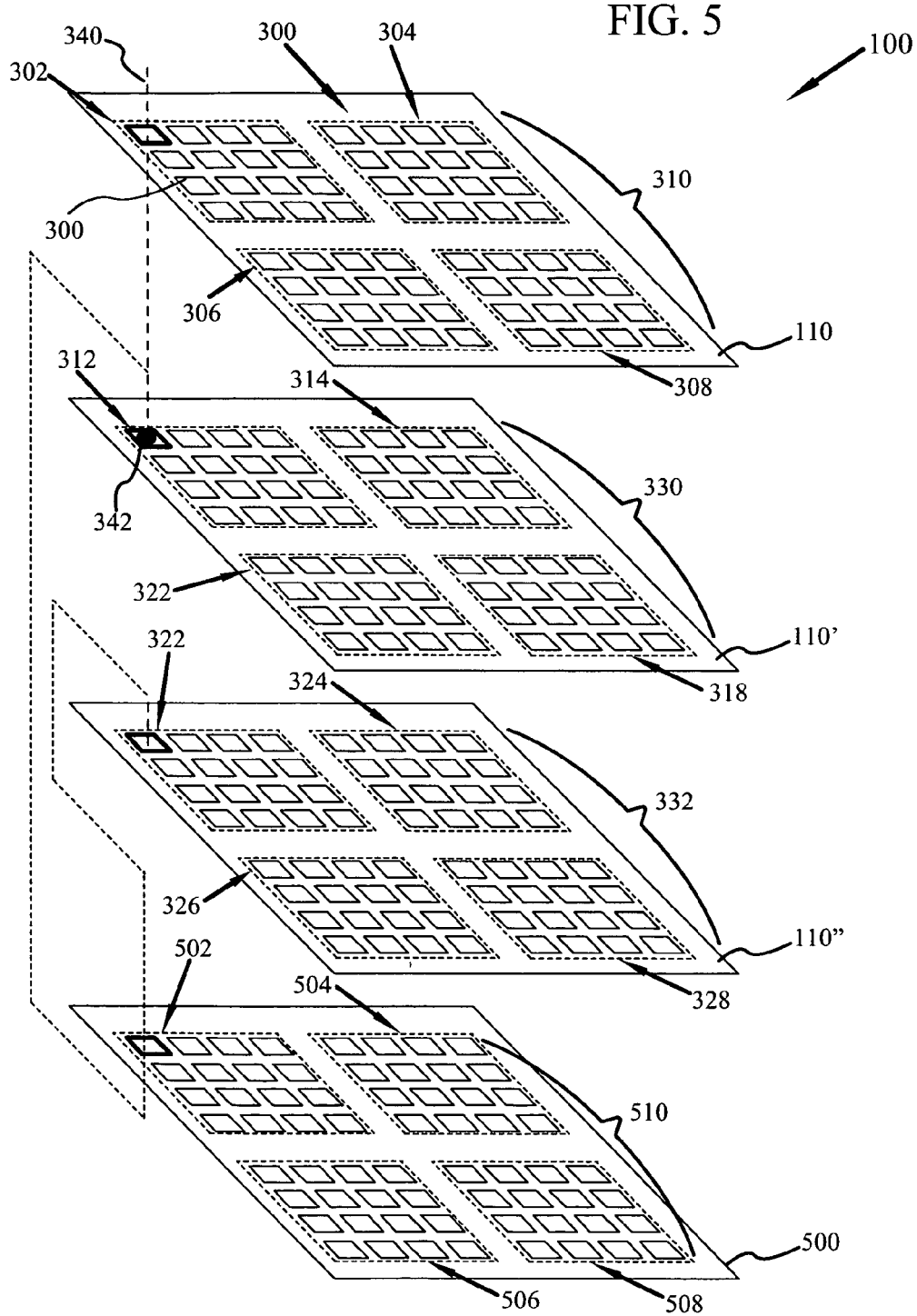
FIG. 5 is a 3-D diagram illustrating the general form of defect management through Sparing on a Dedicated Layer in at least one embodiment.

FIGS. 3, 4 and 5 provide conceptual diagrams to assist in understanding each of these sparing methods. As shown, layer 110 provides a plurality of memory cells 300 allocated into separate arrays, such as arrays 302, 304, 306, 308. The collection of arrays upon layer 110 is identified as a super array 310. Layers 110' and 110" are substantially identical to layer 110, each providing a plurality of memory cells 300 allocated into separate arrays, 312, 314, 316, 318, and 322, 324, 326, 328 respectively. The respective collection of arrays upon layer 110' is identified as super array 330, and upon layer 110" as super array 332. In some embodiments, a physical layer may be divided into more than one super array.

Addressing and selecting memory cells within an array is well understood and appreciated by those in the memory arts. In at least one embodiment, the memory cells of PIRM 100 are fuse or anti-fuse devices. In other words, PIRM 100 may be a write once device, meaning that the state of each memory cell may be changed only once.

When writing data to a media, the group of data bits written to the memory device simultaneously is typically referred to as a word. For purposes of this discussion, each word is comprised of three data bits, each data bit being written to a separate memory cell 300 in a distinct array.

Under Word Sparing, shown in FIG. 3, when an original word represented as dotted line 340 is written, it is initially intended for the virtually aligned set of arrays 302, 312 and 326. In other words, word 340 is directed to a virtual column 334 through the arrays. As discussed above, as shown in the figures, virtual alignment is shown for ease of discussion as vertical alignment, however it is understood and appreciated that virtual alignment and vertical alignment need not co-exist.

Array 312 is determined to be faulty upon encountering a bad cell 342. An array is faulty if it contains defects that render a significant portion of it's storage bits unusable, such as a failure of a sense or address line. In other words, if an address line or sense line fails in an array 312, each memory cell contacted by that failed address line or sense line will be unusable. In that case, the significant portion of storage lost would be recognized as the unusable memory cells. Address lines and sense lines are more fully discussed below.

Determination of array 312 as being faulty may be accomplished by confirming a failure in the write process of the data bit intended for array 312. In at least one embodiment, determination of an array 312 as faulty may also be accomplished by testing addressing and sensing lines, discussed below, before attempting to write data to the array 312.

Upon determination of array 312 as faulty, the entire word 340 is reallocated to spare arrays 306, 316 and 326 as spare word 340', again illustrated as a dotted line. Moreover, the entire virtual column 334 originally selected for word 340 is replaced by spare virtual column 336. In the event of prior successful write operations to the virtual set of arrays 302, 312 and 322, that allocated data is also re-written to a spare virtual set of arrays 306, 316, 326. As the entire word 340 is spared, this defect management is termed Word Sparing.

The method for achieving Word Sparing is controller-based, as will be more fully appreciated in the description below. As spare arrays (306, 316, 326) and main arrays (302, 304, 308 312, 324, 318, 322, 324, 328) are substantially identical, in at least one embodiment the total number of arrays allocated as spares is adjustable. In at least one embodiment the total number of spare arrays is at least about 5% of the total plurality of arrays in PIRM 100.

Under Sparing on a Layer, shown in FIG. 4, when original word 340, is written, it is initially intended for a virtual column 334 in the virtually aligned set of arrays 302, 312 and 326, as in FIG. 3. In this example, array 312 is determined to be faulty based upon an inability to sense or address cell 342. Determination of array 312 as being faulty may be accomplished by confirming a failure in the write process of the data bit intended for array 312. In at least one embodiment, determination of an array 312 as faulty may also be accomplished by testing addressing and sensing lines, discussed below, before attempting to write data to the array 312. Upon determination of array 312 as faulty, the data elements of array 312 are re-allocated to a spare array 316 within the super array containing the defective array 312, as spare virtual column 338.

Moreover, the data bits allocated for the defective memory array 312 are moved to a spare memory array 316 within the same super array 330. The data elements of array 302 and array 322 are not spared as these arrays were not determined to be defective. As sparing occurs only on the layer containing the defective array, this form of defect management is termed Sparing on a Layer.

As shown, arrays 306 and 308 are spare arrays on layer 110, arrays 316 and 318 are spare arrays on layer 110', and arrays 326 and 328 are spare arrays on layer 110". Although the number of spare arrays (306, 308, 316, 318, 326, 328) equals the number of main arrays (302, 304, 312, 314, 322, 324), this is not an imposed condition, but rather a result of illustration simplicity. In at least one embodiment, the number of spare arrays provided upon each layer may be about 5% of the total number of main arrays provided upon the same layer.

Under Sparing on a Dedicated Layer, shown in FIG. 5, at least one additional spare layer 500 is added to the PIRM structure provided by layers 110, 110' and 110". Spare layer 500 provides spare arrays 502, 504, 506 and 508. Collectively these spare arrays provide spare super array 510.

In this example, array 312 is determined to be faulty based upon an inability to sense or address cell 342. Determination of array 312 as being faulty may be accomplished by confirming a failure in the write process of the data bit intended for array 312. In at least one embodiment, determination of an array 312 as faulty may also be accomplished by testing addressing and sensing lines, discussed below, before attempting to write data to the array 312. Upon determination of array 312 as faulty, the sparing of the data is performed by moving the data bits allocated for the defective memory array to a spare memory array 502 in a different super array. As shown, in at least one embodiment, this is a different physical group such as super array 510 on layer 500. As sparing occurs only on a dedicated layer, this form of defect management is termed Sparing on a Dedicated Layer.

For each sparing method it is understood and appreciated that all data written to or intended for the defective array is transferred to the one or more spare arrays. In other words, where data had previously been written to an array 312 before a fault was encountered and the array determined to be faulty, all previously written data is transferred to the spare array 316, 502, as in Sparing on a Layer FIG. 4 or Sparing on a Dedicated Layer FIG. 5, and transferred to the spare arrays 306, 316, 326, as in Word Sparing FIG. 3. It is also appreciated that arrays 312 may be detected as faulty by testing sense and address lines prior to an attempt to write user data to the array. As such, PIRM 100 may be initialized to spare certain arrays as a quality control check in the fabrication process. In at least one embodiment, the number of spare arrays provided upon a dedicated layer is about 5% of the total number of main arrays provided in PIRM 100.

Figure 6:
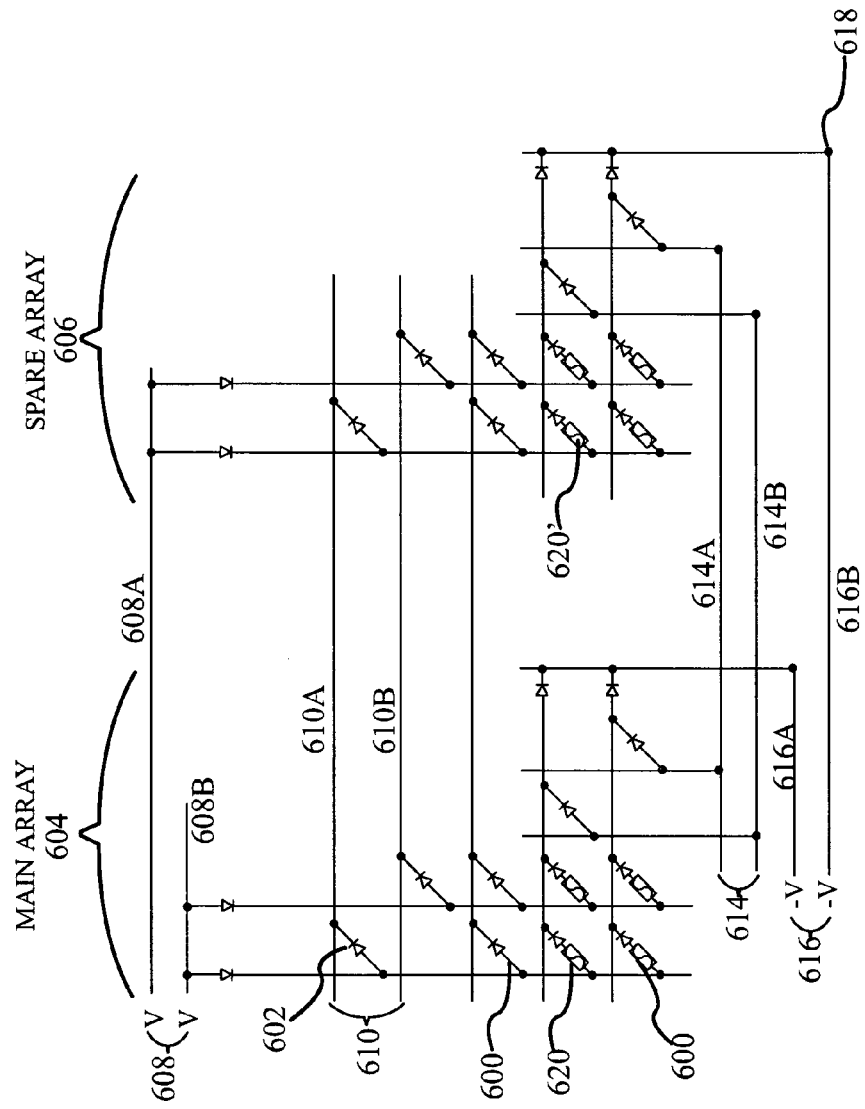
FIG. 6 is a schematic circuit diagram of a simplified Word Sparing embodiment.
Figure 7:
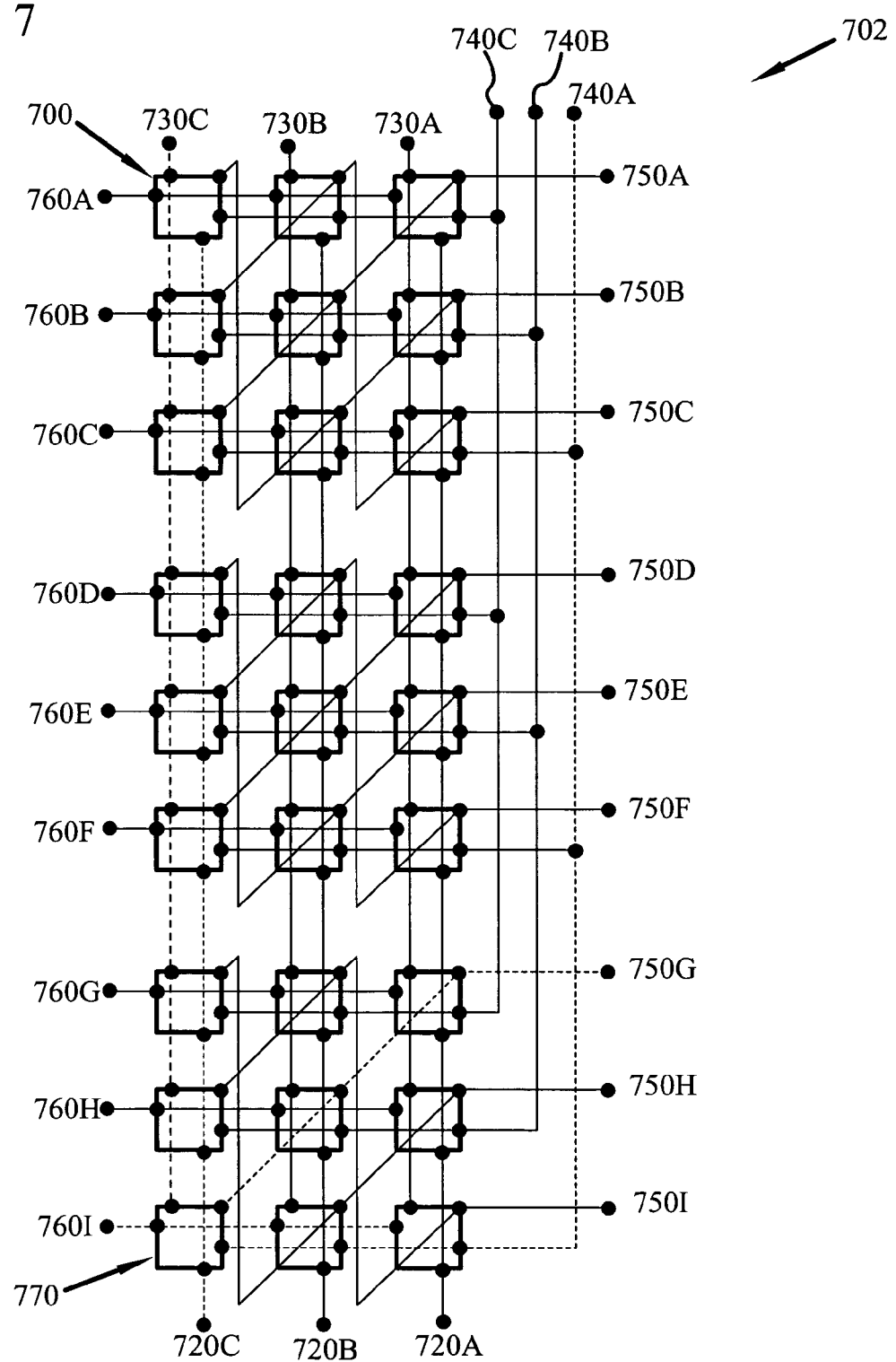
FIG. 7 is a block diagram for a PIRM layer in a Word Sparing embodiment.
Figure 8:
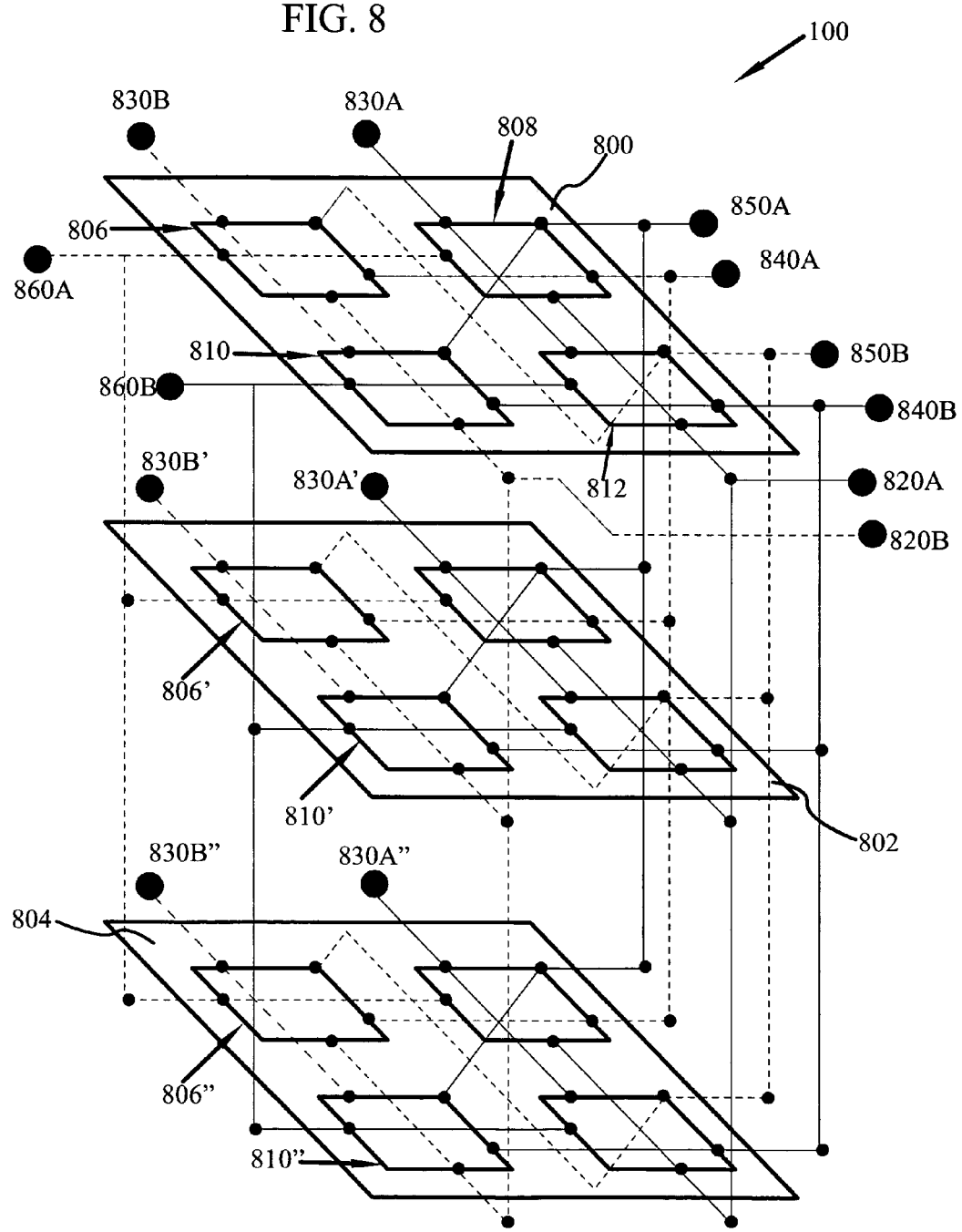
FIG. 8 is a 3-D diagram illustrating the virtual alignment of arrays in a Word Sparing embodiment.

Word Sparing Defect Management:

In light of the above overview, FIGS. 6, 7 and 8 are now provided to further illustrate at least one embodiment of Word Sparing. More specifically, FIG. 6 provides a simplified circuit diagram illustrating at least one configuration for Word Sparing. Memory elements 600 are represented as a fuse and diode in series. Diodes 602 permit the selection and/or isolation of an array or the memory elements within an array.

As shown each array, main array 604 and spare array 606, is electrically wired in a substantially similar fashion. Each is provided with five types of connections—Row Power 608, Row Address 610, Row Sense 612, Column Address 614, and Column Power 616. Although depicted as single lines, these connections may in actuality consist of multiple conductive lines, and may be commonly referred to as busses. Connections between lines (or busses as the case may be), diodes 602 to lines and memory elements 600 to lines are indicated as a solid bullet "●", such as bullet 618. A "bus", alternatively spelled "buss", or in plural form "busses" is understood as a physical electrical interface permitting several devices to share common electrical connection, and is typically composed of an array of electrical wires.

In the embodiment shown, the selection of main array 604 or spare array 606 is determined by the controller (not shown) selecting Row Power 608A and Column Power 616A for main array 604 or Row Power 608B and Column Power 616B for spare array 606. To select specific memory element 620 in main array 604, the following lines are activated—Row Address 610A, Row Sense 612, Column Address 614B, Row Power 608A, and Column Power 616A. If main array 604 is determined to be defective, memory element 620' may be selected in spare array 606 by switching to Row Power 608B and Column Power 616B.

FIG. 7 shows a block diagram of at least one embodiment for PIRM 100 with enabled Word Sparing defect management. Specifically, the block diagram represents the arrays upon a single layer 110 as shown in FIG. 2. For ease of discussion, as shown and described the architecture uses single sided sensing, however it will work with separate row and column sensing if differential sensing embodiments are desired.

In at least one embodiment, the plurality of memory arrays 700 are arranged as a rectangular super array 702. To minimize the number of interconnections to the controller in at least one embodiment, the number of rows of arrays 700 and columns of arrays 700 within super array 702 will not be equal. It is also appreciated, that FIG. 7 illustrates a logical arrangement of arrays 700. Any physical arrangement of arrays 700 that provides the same interconnections between arrays 700 will be equivalent.

The use of shared interconnection lines reduces the number of total connections made to the controller. Typically the greater the number of connection lines to a controller, the more complex the fabrication process and the greater the cost. Therefore, an objective of PIRM 100 architecture is to use the fewest set of address lines, or in other words, to connect the most arrays with the fewest number of direct lines to the controller without creating undesired interconnections that may dissipate excessive power and or contribute unwanted noise to the detection circuits.

One embodiment achieving this desired goal is to logically arrange the super array 702 to include "Q" rows and "R" columns. As shown in FIG. 7 there are 3 rows and 9 columns. Row address bus 720A~C and sense lines 730A~C are routed together There is one row address bus (720A~C) and one sense line (730A~C) for each row in super array 702, for a total of Q (i.e. three) row address bus and sense lines. Similarly there are Q (i.e. three) column address busses 740A~C, each connected to R (i.e. nine) arrays 700. In the case of column address bus 740A~C, every "Qth" array column is connected to the same column address bus.

For each column, there is a separate row power line 760A~I. Similarly, there are R (i.e. 9) separate column power lines 750A~I. Each column power line 750A~I is connected to arrays 700 along a diagonal or other arrangement such that each column power line 750A~I connects to one memory array in each row, and no two memory arrays connected to a column power line 750A~I share the same column address bus 740A~C.

The super array 702 may be divided into regions based on interconnections that are shared by arrays 700. An array with its power, sense, and address lines activated is referred to as an active array. Specifically, array 770 may be selected and activated by activating row address bus 720C, sense line 730C, column address bus 740A, column power line 750G, and row power line 760I. The activation of these specific lines is further illustrated as each line is shown as dotted, to further illustrate that only array 770 is located at the intersection of these five activated lines.

As FIG. 7 illustrates the interconnections within a super array 700 upon a layer, FIG. 8 provides a simplified 3-D block diagram of three virtually aligned super arrays. More specifically, FIG. 8 shows three layers 800, 802, 804, each providing a super array including four arrays, for example arrays 806, 808, 810, 812 on layer 800.

The interconnections between each array 806~812 follow the architecture set forth with respect to FIG. 7, although the number of arrays has been reduced for visual simplicity. There are row address busses 820A~B, sense lines 830A~B, column address busses 840A~B, column power lines 850A~B, and row power lines 860A~B. As may be more fully appreciated with respect to FIG. 8, the row address busses 820, column address busses 840, column power lines 850, and row power lines 860 are commonly interconnected between all three layers 800, 802, 804. Only the sense lines 830 are unique to each layer.

In such a configuration, activating virtually aligned arrays 806, 806', 806" is achieved by activating row address bus 820B, column address bus 840A, column power bus 850A, row power line 860A, and sense lines 830B, 830B' and 830B". As all arrays are substantially identical, as are the interconnection lines, recognition of an array as a main array or a spare array is controller based. For example, of the plurality of arrays provided, a first subset of the plurality are identified by the controller as main arrays (i.e. arrays 806, 808, 812), and a second subset of the plurality are identified as spare arrays (i.e. array 810). This identification may be incorporated into the controller during fabrication of PIRM 100, or achieved through programming of the controller after initial fabrication. In at least one embodiment, such distinction between main arrays and spare arrays by the controller is assisted by a logical mapping table.

When enabled to perform the defect management strategy of Word Sparing, the controller is operable to detect an array within a virtually aligned set as defective, such as for example array 806' in layer 802. When such a detection is made, the controller is further operable to move the entire word intended for arrays 806, 806' and 806" to a spare set of virtually aligned arrays, for example 810, 810', 810". Where words of data have previously been written to the virtually aligned arrays 806, 806' and 806" prior to a fault being encountered in array 806', all previously written data is transferred to the virtually aligned spare arrays 810, 810' and 810".

Figure 9:
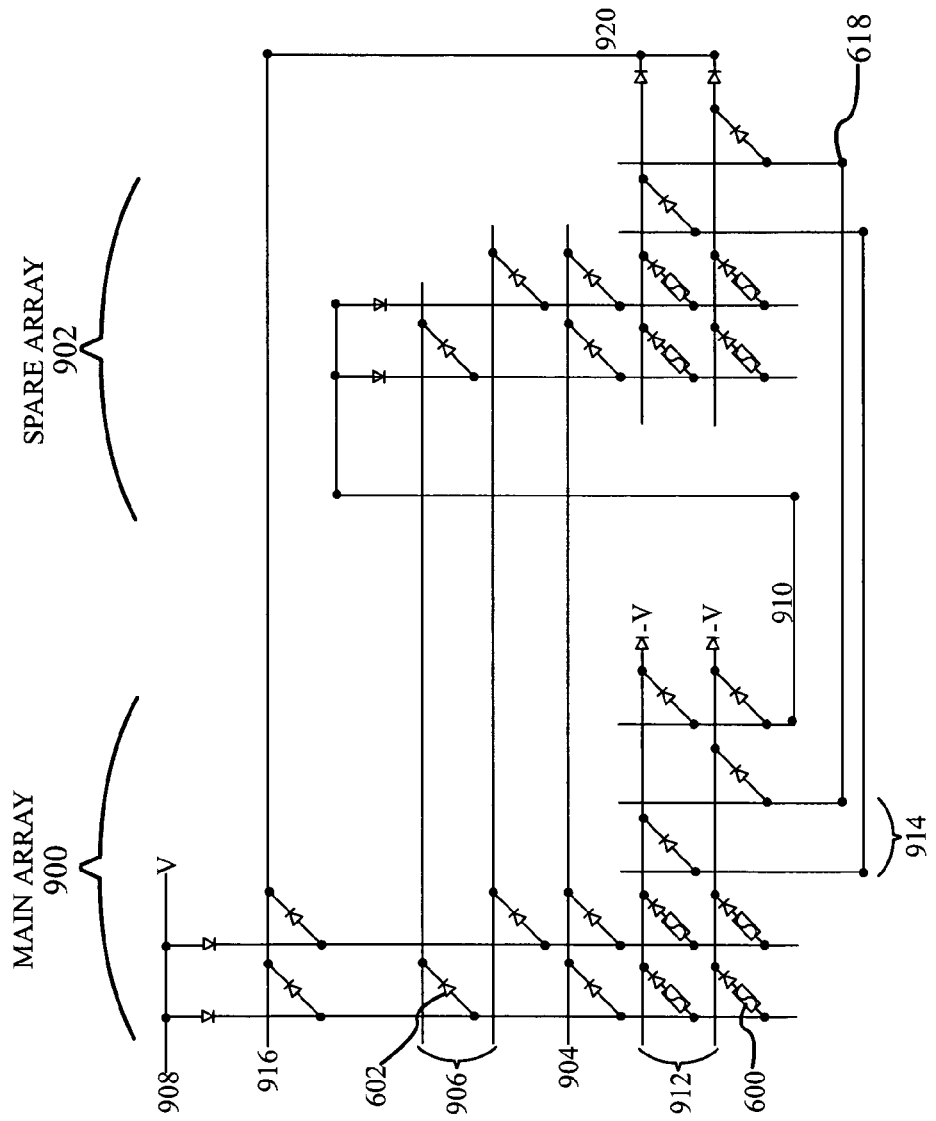
FIG. 9 is a schematic circuit diagram of a simplified Sparing on a Layer embodiment with one spare array.

Sparing on a Layer Defect Management:

FIGS. 9, 10, 11, and 12 are provided to assist with the discussion of at least one embodiment providing Sparing on a Layer. More specifically, FIG. 9 provides a simplified circuit diagram illustrating at least one configuration for Sparing on a Layer. Memory elements 600 are represented as a fuse and diode in series. Diodes 602 permit the selection and/or isolation of an array or the memory elements within an array. Connections between lines, diodes 602 to lines and memory elements 600 to lines are indicated as a solid bullet "●", such as bullet 618. Although depicted as single lines for ease of discussion, connection lines may in actuality consist of multiple conductive lines, and may be referred to as busses. Memory elements within main array 900 are selected in the manner described above with respect to the main array in FIG. 6.

As shown in FIG. 9, main array 900 is wired differently from spare array 902. Main array 900 is provided with 7 connections—sense line 904, row address bus 906, row power lines 908, column spare line 910, column power lines 912, column address bus 914, and row spare line 916. The spare array 902 has 5 connections. Spare array 902 shares sense line 904, row address bus 906 and column address bus 914 with main array 900. Row power 908 is provided to spare array 902 by column spare line 910 from main array 900. Likewise, column power 920 is provided to spare array 902 by row spare line 916 from main array 900.

In the above description of Word Sparing, all arrays within PIRM 100 are substantially identical and the distinction of an array as a main array or a spare array is controller based. While simplistic from a fabrication viewpoint, this means that replacing one defective array requires an entire word of spare arrays, because all arrays in that word are spared. In Sparing on a Layer, at least one spare array is paired with at least one main array, and typically several main arrays. This requires only one spare array to replace one defective array. More specifically, spare arrays are paired to main arrays by physical interconnection lines.

Figure 10:
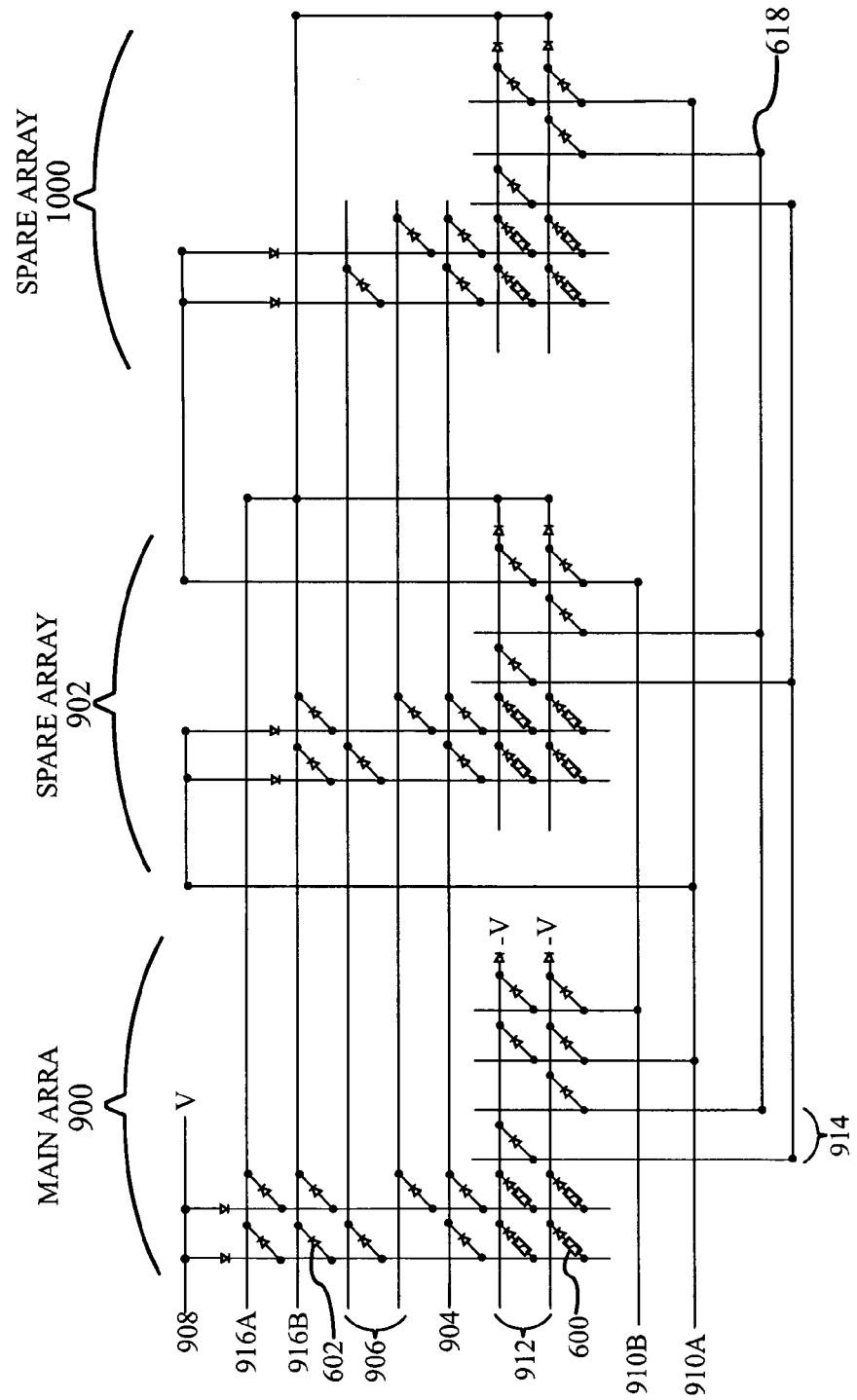
FIG. 10 is a schematic circuit diagram of a simplified Sparing on a Layer embodiment with two spare arrays.

FIG. 10 provides another simplified diagram illustrating another configuration for Sparing on a Layer, this time showing a second spare array 1000. As spare arrays are typically associated with more than one main array, a failure in more than one of those main arrays would require additional spare arrays. In at least one embodiment it is therefore desirable to provide additional spare arrays.

In Sparing on a Layer, it is necessary to deactivate the defective main array, because it shares a sense line with its spare array. It is also necessary to activate the first spare array 902 only when replacing failed main array 900, and spare array 1000 only when another main array or spare array 902 has failed. By utilizing a crossing architecture of wires and specific placement of diodes 602, Sparing on a Layer permits PIRM 100 to operate with power delivered only to the properly functioning array, be that main array 900, spare array 902 or second spare array 1000. In other words, the defective array is deactivated when the spare array is activated. In addition, activation and deactivation is performed with a matched set of connection lines. Further, the connection lines deactivating the defective array also activate the spare array.

As in FIG. 9, spare array 902 and spare array 1000 share sense line 904, row address bus 906 and column address bus 912 with main array 900. The deactivation of main array 900 and activation of spare array 902 is enabled by a matched set of row spare line 916A and column spare lines 910A from main array 900. By pulling row spare line 916A to −V and column spare line 910A to +V, all address lines on main array 900 are disabled, and power is applied to spare array 902. Row spare line 916A ultimately provides column power to spare array 902 and column spare line 910A ultimately provides row power to spare array 902. Similarly, main array 900 is disabled and spare array 1000 is activated by applying −V to row spare line 916B and +V to column spare line 910B. Additionally row spare lines 916 and column spare lines 910 are connected to disable the respective address lines of the unused spare array to provide additional protection in case of a failure of a spare line. In at least one embodiment, application of +V or −V as described above may be directed by controller 106 shown in FIGS. 1 and 2. In an alternative embodiment diode or fuse elements of the address circuitry may be purposefully overloaded so as to effectively hardwire the spare pathway for a +V or −V.

Figure 11:
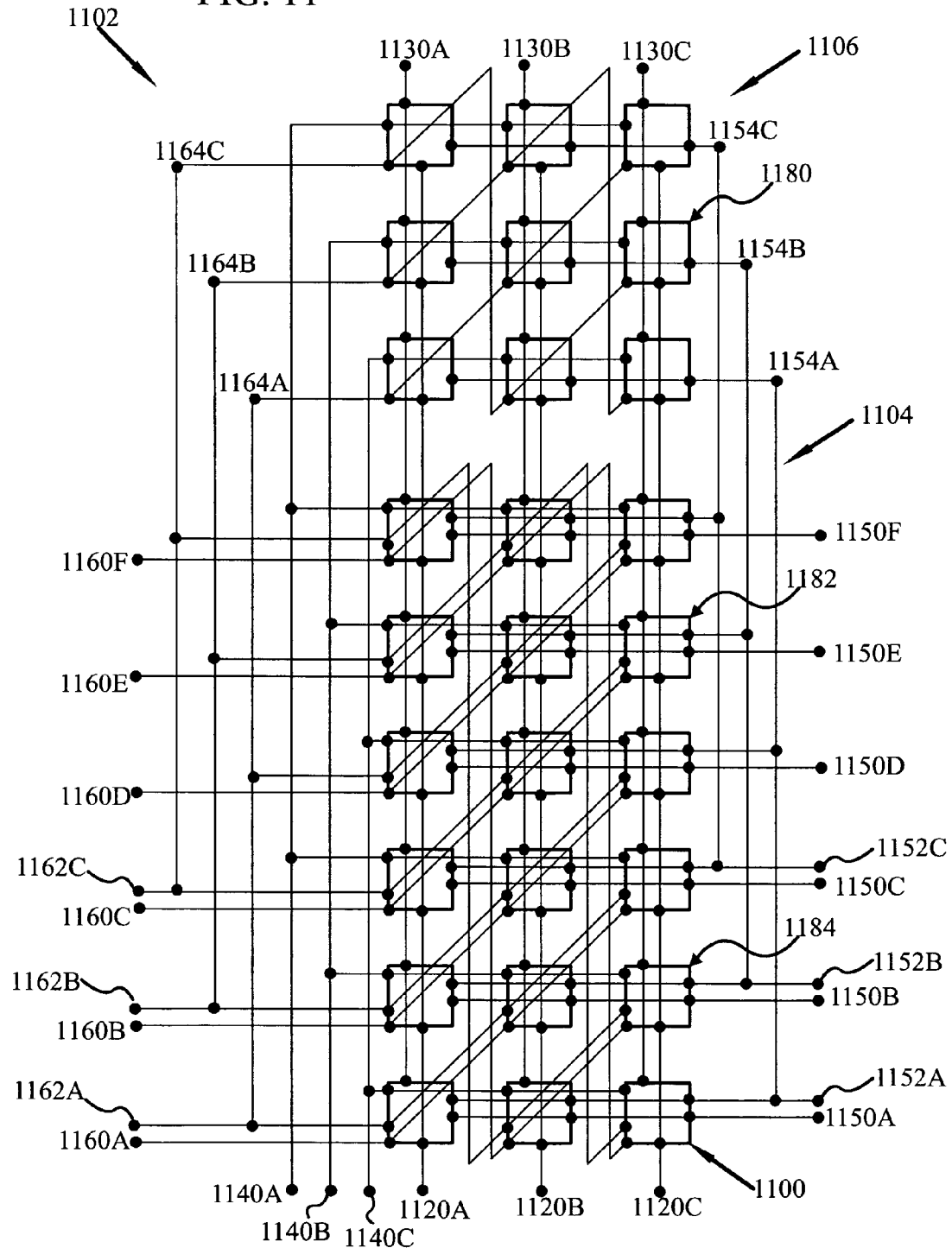
FIG. 11 is a block diagram for a PIRM layer in a Sparing on a Layer embodiment.

FIG. 11 shows a block diagram of at least one embodiment for PIRM 100 with enabled Sparing on a Layer defect management. Specifically, the block diagram represents the arrays upon a single layer 110 as shown in FIG. 2. For ease of discussion, as shown and described the architecture uses single sided sensing, however it will work with separate row and column sensing if differential sensing embodiments are desired.

In at least one embodiment, the plurality of memory arrays 1100 are arranged as a rectangular super array 1102. To minimize the number of interconnections to the controller in at least one embodiment, the number of rows of arrays 1100 and columns of arrays 1100 within super array 1102 will not be equal. It is also appreciated, that FIG. 11 illustrates a logical arrangement of arrays 1100. Any physical arrangement of arrays 1100 that provides the same interconnections between arrays 1100 will be equivalent.

As noted above, the use of shared interconnection lines is generally preferable in terms of minimizing fabrication costs and system design complexity. One embodiment achieving this desired goal is to logically arrange the super array 1102 to include "Q" rows and "R" columns. As shown in FIG. 11 there are 3 rows and 9 columns. Of the plurality of arrays 1100 provided upon the layer, a first subset 1104 of the plurality is identified as main arrays, and a second subset 1106 of the plurality are identified as spare arrays. Such classification as a main array or a spare array is at least in part based upon the employed architecture of interconnection lines between the main arrays in first subset 1104 and the spar arrays in second subset 1106.

Row address bus 1120A~C and sense lines 1130A~C are routed together. There is one row address bus (1120A~C) and one sense line (1130A~C) for each row in super array 1102, for a total of Q (i.e. three) row address bus and sense lines. Similarly there are Q (i.e. three) column address busses 1140A~C, each connected to R (i.e. nine) arrays 1100, six main arrays in first subset 1104 and three spare arrays in second subset 1106. In the case of column address bus 1140A~C, every "Qth" array column is connected to the same column address bus.

For each column, there is a separate row power line 1150A~F. There are Q number (i.e. three) column spare lines 1152A~C paired with row power lines 1150A~C and again with row power lines 1150D~F. Column spare lines 1152A~C connect to spare row power lines 1154A~C.

Each column power line 1160A~F is connected to arrays 1100 in first subset 1104 along a diagonal or other arrangement such that each column power line 1160A~F connects to one memory array in each row, and no two memory arrays connected to a column power line 1160A~F share the same column address bus 1140A~C. There are Q number (i.e. three) row spare lines 1162A~C paired with column power lines 1160A~C and again with row power lines 1150D~F. Row spare lines 1162A~C connect to spare column power lines 1164A~C.

An array with it's power, sense, and address lines (or busses) activated is referred to as an active array. The functional relationship of column spare lines 1152A~C and row spare lines 1162A~C is such that either a main array in first subset 1104 is active or a paired spare array in second subset 1106 is active, but not both.

With respect to FIG. 11, the physical paring of spare arrays in second subset 1106 to main arrays in first subset 1104 may be more fully appreciated. Specifically, as shown by the interconnection lines, spare array 1180 is paired with main arrays 1182 and 1184. Substantially similar interconnections pair the remaining spare arrays of second subset 1106 to the remaining main arrays of first subset 1104.

Figure 12:
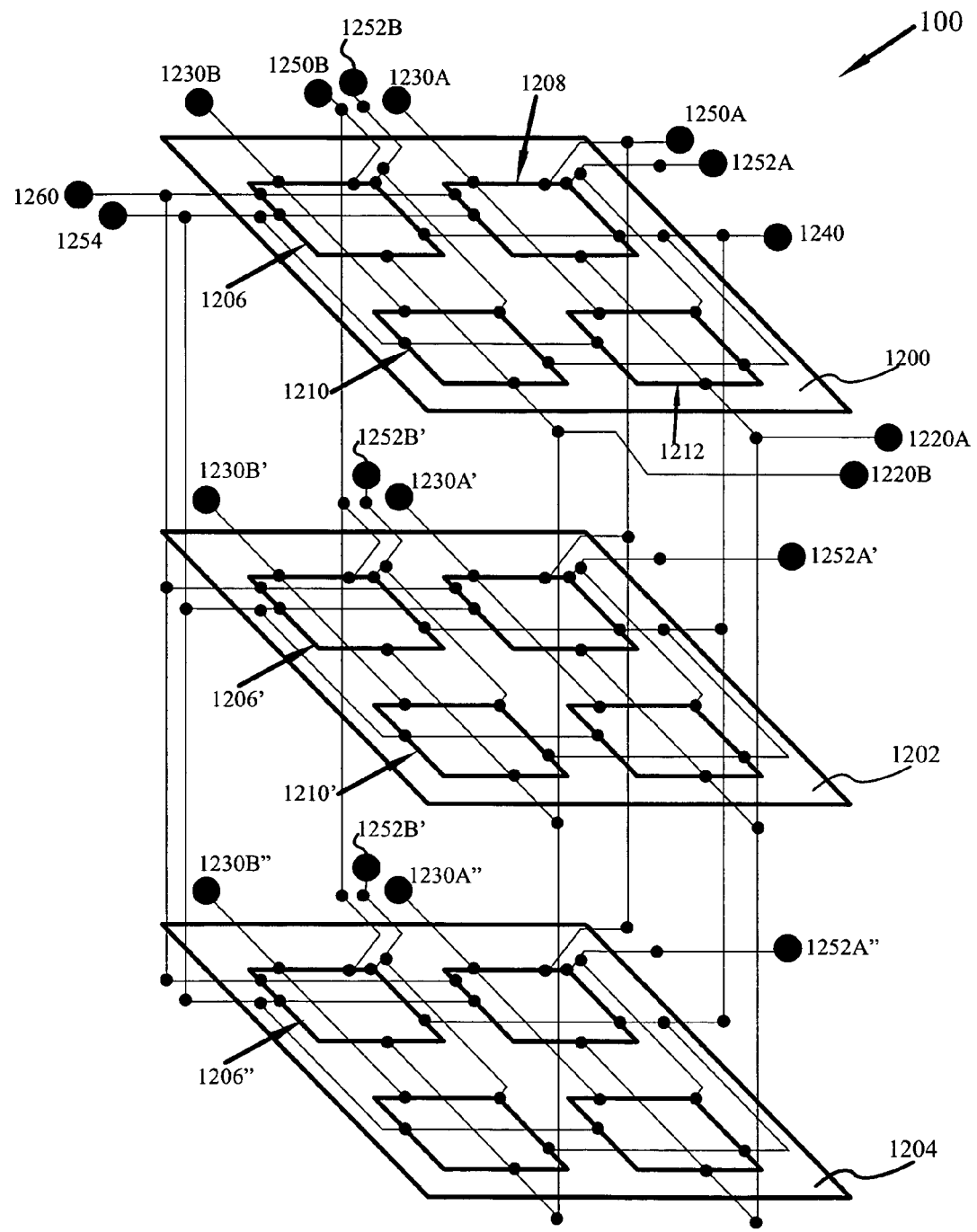
FIG. 12 is a 3-D diagram illustrating the virtual alignment of arrays in a Sparing on a Layer embodiment.

As FIG. 11 illustrates the interconnections within a super array 1102 upon a layer, FIG. 12 provides a simplified 3-D block diagram of three virtually aligned super arrays. More specifically, FIG. 12 shows three layers 1200, 1202, 1204, each providing a super array including four arrays, for example arrays 1206, 1208, 1210, 1212 on layer 1200.

The interconnections between each array 1206~1212 follow the architecture set forth with respect to FIG. 11, although the number of arrays has been reduced for visual simplicity. More specifically, arrays 1206 and 1208 are main arrays and arrays 1210 and 1212 are spare arrays.

There are row address busses 1220A~B, sense lines 1230A~B, column address bus 1240, column power lines 1250A~B, and row power line 1260, row spare line 1252A~B, and column spare lines 1254. As may be more fully appreciated with respect to FIG. 12, all interconnections except for sense lines 1230 and row and column spare lines 1252, 1254 are commonly shared between layers 1200, 1202 and 1204. In other words, only the sense lines 1230 and row and column spare lines 1252, 1254 are unique to each layer.

In such a configuration, activating virtually aligned arrays 1206, 1206', 1206" is achieved by activating row address bus 1220B, column address bus 1240, column power line 1250A, row power line 1260, and sense lines 1230B, 1230B' and 1230B". As discussed above, when an array is identified as being defective, such as array 1206' on layer 1202, sparing to array 1210' on layer 1202 is accomplished by row spare line 1252B' and column spare line 1254' deactivating array 1206' and activating spare array 1210'

Where data has been previously written to array 1206' prior to a fault being encountered in array 1206', all previously written data is transferred from defective array 1206' on layer 1202 to spare array 1210' on layer 1202. The new virtually aligned arrays are therefore 1206, 1210' and 1206".

Figure 13:
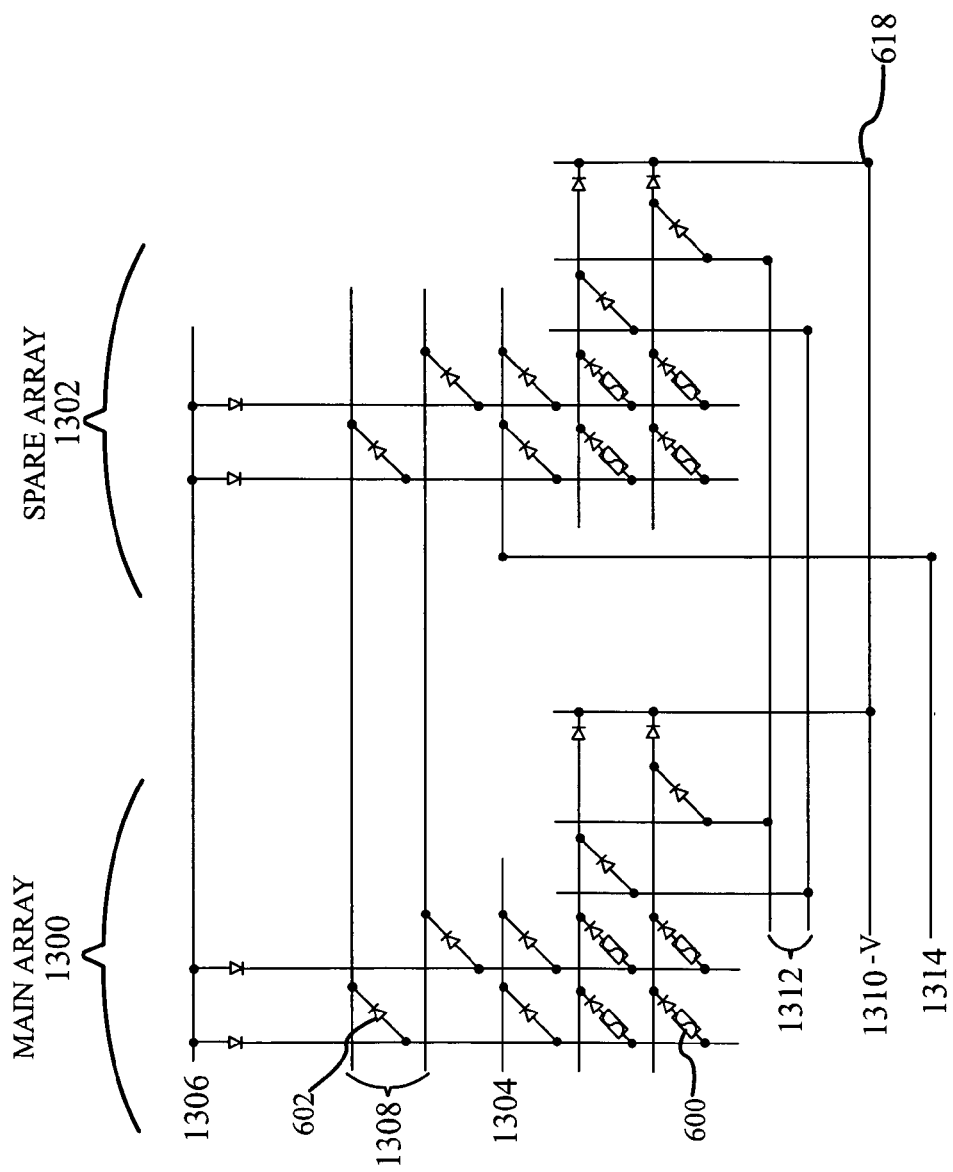
FIG. 13 is a schematic circuit diagram of a simplified Sparing on a Dedicated Layer embodiment.
Figure 14:
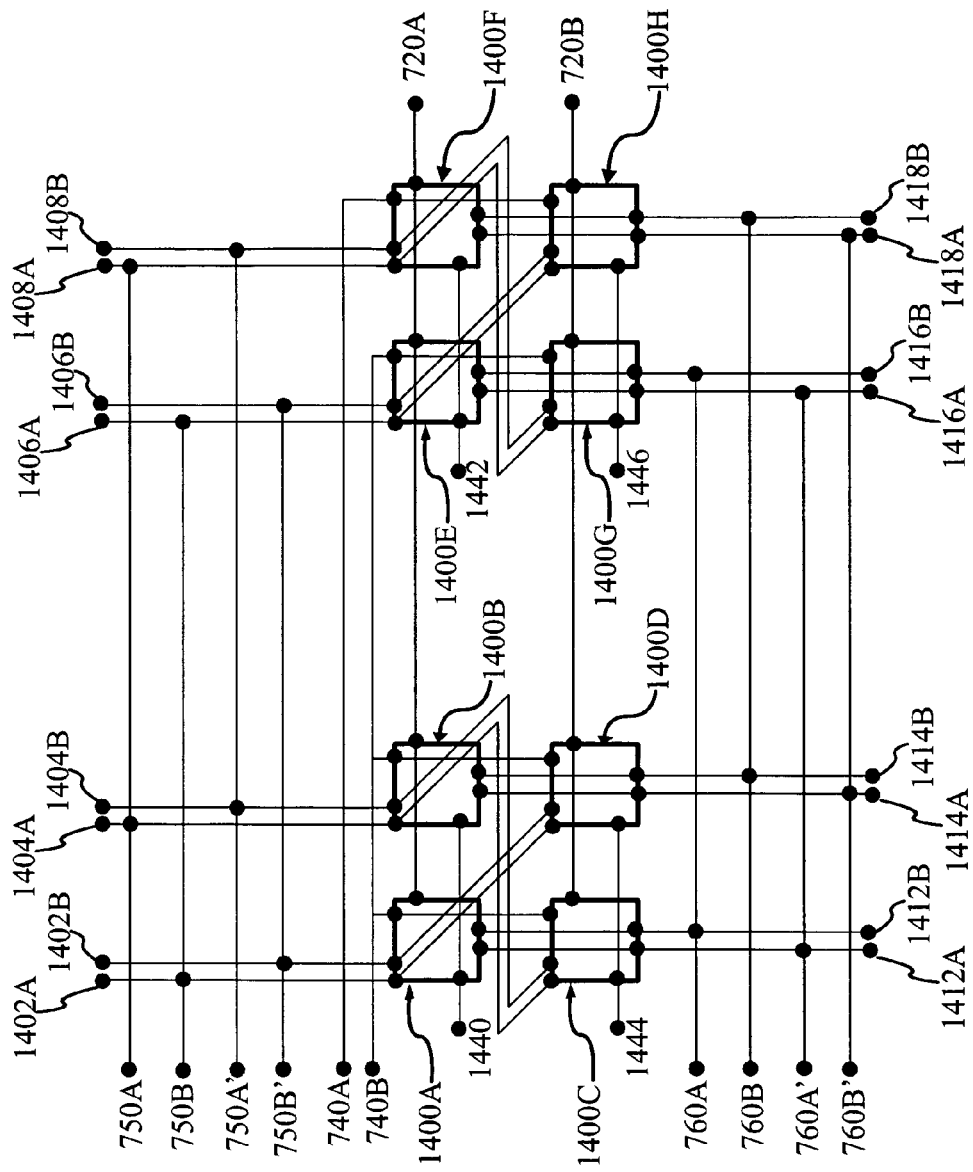
FIG. 14 is a block diagram for a PIRM layer in a Sparing on a Dedicated Layer embodiment.

Sparing on a Dedicated Layer Defect Management:

FIGS. 13 and 14 are provided to assist with the discussion of at least one embodiment providing Sparing on a Dedicated Layer. More specifically, FIG. 13 provides a simplified circuit diagram illustrating at least one configuration for Sparing on a Dedicated Layer. Memory elements 600 are represented as a fuse and diode in series. Diodes 602 permit the selection and/or isolation of an array or the memory element within an array. Connections between lines, diodes 602 to lines and memory elements 600 to lines are indicated as a solid bullet "●", such as bullet 618. Again, although depicted as single lines for ease of discussion, connection lines may in actuality consist of multiple conductive lines, and may be referred to as busses. Memory elements within main array 1300 are selected in the manner described above with respect to the main array in FIG. 6.

As in the above embodiments for Word Sparing and Sparing on a Layer, the plurality of arrays within PIRM 100 may be recognized as consisting of two subsets of arrays. A first subset of the plurality that is identified as main arrays, and a second subset of the plurality that is identified as spare arrays. In contrast to the embodiments of Word Sparing and Sparing on a Layer wherein the spare arrays are present within the same physical groups or layers providing main arrays, in an embodiment for Sparing on a Dedicated Layer, the spare layers are provided on a separate layer.

As shown in FIG. 13, main array 1300 and spare array 1302 are wired in a substantially similar architecture. Main array 1300 is provided with sense line 1304, row power lines 1306, row address bus 1308, column power lines 1310, and column address bus 1312. Spare array 1302 is paired with main array 1300 and shares row power lines 1306, row address bus 1308, column power lines 1310, and column address bus 1312 in common with main array 1300. Spare array 1302 is provided with a separate sense line 1314.

As spare array 1302 is coupled to the same interconnects coupling to the main array 1300, save the sense line 1304, both arrays are activated simultaneously. The selection of which array is recognized as active is based on the controller selecting either sense line 1304, coupling to main array 1300, or sense line 1314, coupling to spare array 1302.

FIG. 14 shows a block diagram of at least one embodiment for PIRM 100 with enabled Sparing on a Dedicated Layer defect management. Specifically, the block diagram represents the spare arrays 1400 upon a dedicated spare layer. For ease of discussion, as shown and described the architecture uses single sided sensing, however it will work with separate row and column sensing if differential sensing embodiments are desired.

In at least one embodiment, the dedicated spare layer is coupled to the super array of a layer having an architecture as shown in FIG. 7, used above in the discussion of Word Sparing. More specifically, row address bus 720A~B, column address bus 740A~B, column power lines 750A~B, and row power lines 760A~B initially shown in FIG. 7, and column power lines 750A'~B', and row power lines 760A'~B', from a second main array layer not shown, are duplicated in FIG. 14.

To provide sparing utility to multiple main arrays, multiple spare column power lines and spare row power lines are provided. More specifically, each spare array will receive an additional set of power interconnection lines for each main array layer it is paired to.

As shown, each spare array 1400 is coupled to two main arrays, not shown. Specifically spare column power lines 1402A~B couple spare arrays 1400A and 1400D to column power lines 750B and 750B'. Spare column power lines 1404A~B couple spare arrays 1400B and 1400C to column power lines 750A and 750A'. Spare column power lines 1406A~B couple spare arrays 1400E and 1400H to column power lines 750B and 750B'. Spare column power lines 1408A~B couple spare arrays 1400F and 1400G to column power lines 750A and 750A'.

Similarly, spare row power lines 1412A~B couple spare arrays 1400A and 1400C to row power lines 760A and 760A'. Spare row power lines 1414A~B couple spare arrays 1400B and 1400D to row power lines 760B and 760B'. Spare row power lines 1416A~B couple spare arrays 1400E and 1400G to row power lines 760A and 760A'. Spare row power lines 1418A~B couple spare arrays 1400F and 1400H to row power lines 760B and 760B'.

Separate sense lines 1440, 1442, 1444, 1446 are provided to spare arrays 1400, interconnecting them directly with the controller, not shown. When a main array is determined to be defective, activation of the corresponding spare sense line permits sparing to the paired spare array 1400 upon the dedicated layer. In other words, the PIRM 100 is operable such that the main array is activated simultaneously with a paired spare array, the controller being operable to select a main sense line or a spare sense line.

Sparing on a dedicated layer may be preferred over Word Sparing, as only the defective array is spared. Sparing on a dedicated layer may be preferred over Sparing on a Layer as the interconnection lines required on each main array layer do not perform activation and deactivation when sparing is performed.

Having described the above physical embodiments of defect management enabled PIRM 100, another embodiment relating to the method of use will now be described with reference to the Flowchart of FIG. 15 and the components describe above. It will be appreciated that the described method need not be performed in the order in which it is herein described, but that this description is merely exemplary of at least one method for using defect management enabled PIRM 100 in accordance with the present invention.

Figure 15:
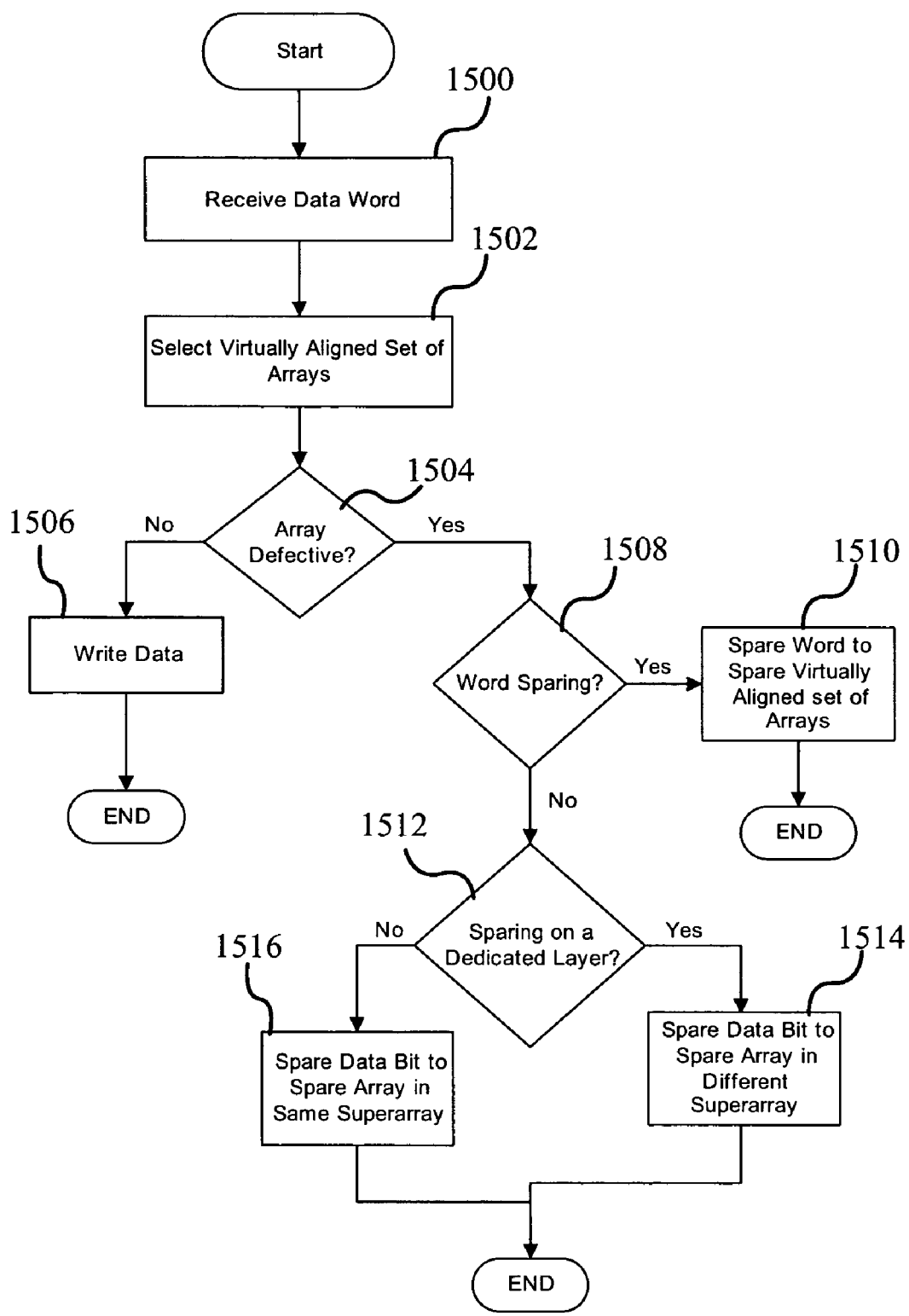
FIG. 15 is a flowchart of sparing methods employed by embodiments of defect enabled PIRM.

Referring to the components illustrated in FIG. 2 through FIG. 5 and the flowchart of FIG. 15, as shown in block 1500, initially a word of data is received by PIRM 100. The controller 106 selects a virtually aligned set of arrays 302, 312, 322, as indicated in block 1502.

Each array of the virtually aligned set is then evaluated as indicated in decision block 1504. If the arrays of the virtually aligned set are not defective, the word of data is written to the selected virtually aligned set of arrays 302, 312, 322, block 1506.

If an array is determined to be defective in decision block 1504, then defect management enabled PIRM 100 will perform sparing, such as the above describe Word Sparing, Sparing on a Layer, or Sparing on a Dedicated Layer. The type of sparing to be performed is generally established by the architecture of PIRM 100.

The first type of sparing described above is Word Sparing. If PIRM 100 is employing Word Sparing (decision block 1508), then the entire word 340 is reallocated (block 1510) to a virtually aligned set of spare arrays 306, 316, 326 as spare word 340', see FIG. 3.

In Sparing on a Layer and Sparing on a Dedicated Layer as described above and illustrated in FIGS. 4 and 5, if an array is determined to be defective, the data bit intended for the defective array is reallocated to a spare array. As shown in decision block 1512, the choice of sparing actions is different. If PIRM 100 is enabled to perform Sparing on a Dedicated Layer, block 1514, then as shown in FIG. 5 the data bit intended for the defective array 312 is spared to a spare array in a different super array, such as array 502 in a separate super array 510 on physically separate layer 500. If PIRM 100 is not enabled for Word Sparing or Sparing on a Dedicated Layer, then it will be enabled to perform Sparing on a Layer, block 1516. In Sparing on a Layer the data bit intended for the defective array 312 is spared to a spare array 316 within the same super array 330, see FIG. 4.

Changes may be made in the above methods, systems and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

What is claimed is:

1. A defect management enabled PIRM comprising:
   a data storage medium providing a plurality of stacked physical layers, each layer providing a plurality of cross point data storage arrays each providing a plurality of memory cells, the plurality of data storage arrays on each layer allocated into separate super arrays on each layer, the separate super arrays virtually aligned as sets;
   a controller capable of establishing the selection of a virtually aligned set of arrays and a virtually aligned set of memory cells;
   the controller being operable during a data write operation to receive a word of data bits and detect a defective cell in a defective array in a selected virtually aligned set of memory cells, the controller further directing the allocation of at least one data bit from the defective memory array to a spare memory array;
   wherein the controller is operable to perform Sparing on a Layer, moving the data bit allocated for the defective memory array to a spare memory array within the super array containing the defective array;
   wherein a first subset of the plurality of arrays are main arrays, and a second subset of the plurality of arrays are spare arrays;
   wherein the PIRM is operable such that the defective array is deactivated when the spare, array is activated;
   wherein activation and deactivation is performed with a matched set of connection lines; and
   wherein the same lines deactivating the defective main array activate the spare array.

2. A defect management enabled PIRM comprising:
   a data storage medium providing a plurality of stacked physical layers, each layer providing a plurality of cross point data storage arrays each providing a plurality of memory cells, the plurality of data storage arrays on each layer allocated into separate super arrays on each layer the separate super arrays virtually aligned as sets, wherein a first subset of the plurality of arrays are main arrays, and a second subset of the plurality of arrays are spare arrays;
   a controller capable of establishing the selection of a virtually aligned set of arrays and a virtually aligned set of memory cells;
   the controller being operable during a data write operation to receive a word of data bits and detect a defective cell in a defective array in a selected virtually aligned set of memory cells, the controller further directing the allocation of at least one data bit from the defective memory array to a spare memory array;
   wherein the controller is operable to perform Sparing on a Dedicated Layer, moving the data bit allocated for the defective memory array to a spare memory array in a different super array; and
   wherein the PIRM is operable such that the main array is activated simultaneously with a paired spare array, the controller operable to select a main sense line or a spare sense line.

3. A defect management enabled PIRM comprising:
   a data storage medium providing a plurality of stacked physical layers, each layer providing a plurality of cross point data storage arrays each providing a plurality of memory cells, each array receiving row power, column power, row address, column address, and sense/write enable connections, the plurality of data storage arrays allocated into separate super arrays, the separate super arrays virtually aligned as sets wherein a first subset of the plurality of arrays are main arrays, and a second subset of the plurality of arrays are spare arrays;
   a controller capable of establishing the selection of a virtually aligned set of arrays and a virtually aligned set of memory cells;
   the controller being operable during a data write operation to receive a word of data bits and detect a defective array in the selected virtually aligned set of memory arrays, the controller further directing the allocation of at least one data bit from the defective memory array to a spare memory array;
   wherein the PIRM is configured and the controller operable to perform a sparing operation selected from the group consisting of:
   Word Sparing wherein the complete word of data bits is moved from the selected virtually aligned set of memory arrays having the detected defective array to a spare set of vertically aligned memory arrays wherein the main arrays and spare arrays are substantially identical,
   Sparing on a Layer wherein the data bit allocated for the defective memory array is moved from the defective memory array to a spare memory array within the same super array containing the defective array,
   Sparing on a Dedicated Layer wherein the data bit allocated for the defective memory array is moved from the defective memory array to a spare memory array in a different super array,
   and combinations thereof.

4. A defect management enabled PIRM comprising:
   a data storage medium providing a plurality of stacked physical layers, each layer providing a plurality of cross point data storage arrays each providing a plurality of memory cells, each array receiving row power, column power, row address, column address, and sense/write enable connections, the plurality of data storage arrays allocated into separate super arrays, the separate super or arrays virtually aligned as sets, wherein a first subset of the plurality of arrays are main arrays, and a second subset of the plurality of arrays are spare arrays;

a controller capable of establishing the selection of a virtually aligned set of arrays and a virtually aligned set of memory cells;

the controller being operable during a data write operation to receive a word of data bits end detect a defective array in the selected virtually aligned set of memory arrays, the controller further directing the allocation of at least one data bit from the defective memory array to a spare memory array;

wherein the PIRM is configured and the controller operable to perform a sparing operation selected from the group consisting of:

Word Sparing wherein the complete word of data bits is moved from the selected virtually aligned set of memory arrays having the detected defective array to a spare set of vertically aligned memory arrays, Sparing on a Layer wherein the data bit allocated for the defective memory array is moved from the defective memory array to a spare memory array within the same super array containing the defective array, Sparing on a Dedicated Layer wherein the data bit allocated for the defective memory array is moved from the defective memory array to a spare memory array in a different super array wherein a spare array paired to at least one main array share in common row power and column power lines, and combinations thereof.

5. A defect management enabled PIRM comprising:

a data storage medium providing a plurality of stacked physical layers, each layer providing a plurality of cross point data storage arrays each providing a plurality of memory cells, each array receiving row power, column power, row address, column address, and sense/write enable connections, the plurality of data, storage arrays allocated into separate super arrays, the separate super arrays virtually aligned as sets, wherein a first subset of the plurality of arrays are main arrays, and a second subset of the arrays are spare arrays;

a controller capable of establishing the selection of a virtually aligned set of arrays and a virtually aligned set of memory cells;

the controller being operable during a data write operation to receive a word of data bits and detect a defective array in the selected virtually aligned set of memory arrays, the controller further directing the allocation of at least one data bit from the defective memory array to a spare memory array;

wherein the PIRM is configured and the controller operable to perform a sparing operation selected from the group consisting of:

Word Sparing wherein the complete word of data bits is moved from the selected virtually aligned set of memory arrays having the detected defective array to a spare set of vertically aligned memory arrays, Sparing on a Layer wherein the data bit allocated for the defective memory array is moved from the defective memory array to a spare memory array within the same super array containing the defective array, Sparing on a Dedicated Layer wherein the data bit allocated for the defective memory array is moved from the defective memory array to a spare memory array in a different super array wherein separate sense lines interconnect the spare arrays to the controller and the main arrays to the controller, and combinations thereof.

6. A defect management enabled PIRM comprising:

a data storage medium providing a plurality of stacked physical layers, each layer providing a plurality of cross point data storage arrays each providing a plurality of memory cells, each array receiving row power, column power, row address, column address, and sense/write enable connections, the plurality of data storage arrays allocated into separate super arrays, the separate super arrays virtually aligned as sets;

a controller capable of establishing the selection of a virtually aligned set of arrays and a virtually aligned set of memory cells;

the controller being operable during a data write operation to receive a word of data bits and detect a defective array in the selected virtually aligned set of memory arrays, the controller further directing the allocation of at least one data bit from the defective memory array to a spare memory array;

wherein the PIRM is configured and the controller operable to perform a sparing operation selected from the group consisting of;

Word Sparing wherein the complete word of data bits is moved from the selected virtually aligned set of memory arrays having the detected defective array to a spare set of vertically aligned memory arrays, Sparing on a Layer wherein the data bit allocated for the defective memory array is moved from the defective memory array to a spare memory array within the same super array containing the defective array wherein a spare array paired to at least one main array by a matched set of row spare and column spare lines, and Sparing on a Dedicated Layer wherein the data bit allocated for the defective memory array is moved from the defective memory array to a spare memory array in a different super array, and combinations thereof.

7. The defect management enabled PIRM of claim 6, wherein the PIRM is operable such that when the spare array is activated the paired main array is deactivated.

* * * * *